(12) United States Patent
Ulmer

(10) Patent No.: US 10,333,036 B2
(45) Date of Patent: Jun. 25, 2019

(54) ABSORPTIVE COLOR CONVERSION FILM

(71) Applicant: eLux Inc., Vancouver, WA (US)

(72) Inventor: Kurt Ulmer, Vancouver, WA (US)

(73) Assignee: eLux Inc., Vancouver, WA (US)

( * ) Notice: Subject to any disclaimer, the term of this patent is extended or adjusted under 35 U.S.C. 154(b) by 0 days.

(21) Appl. No.: 15/995,486

(22) Filed: Jun. 1, 2018

(65) Prior Publication Data

US 2018/0366622 A1 Dec. 20, 2018

Related U.S. Application Data

(63) Continuation-in-part of application No. 15/849,859, filed on Dec. 21, 2017, which is a
(Continued)

(51) Int. Cl.
*H01L 33/50* (2010.01)
*H01L 25/075* (2006.01)
(Continued)

(52) U.S. Cl.
CPC .......... *H01L 33/505* (2013.01); *B41J 2/2103* (2013.01); *H01L 25/0753* (2013.01);
(Continued)

(58) Field of Classification Search
CPC ........ H01L 33/06; H01L 33/005; H01L 33/50
See application file for complete search history.

(56) References Cited

U.S. PATENT DOCUMENTS

2003/0108804 A1 6/2003 Cheng et al.
2011/0069496 A1* 3/2011 Ing ................... B29D 11/00798
362/311.02
(Continued)

FOREIGN PATENT DOCUMENTS

EP 2840120 2/2015

OTHER PUBLICATIONS

Nam, Changwoo, et al. "Petrogel: New hydrocarbon (oil) absorbent based on polyolefin polymers." Macromolecules 49.15 (2016): 5427-5437.

*Primary Examiner* — Sitaramarao S Yechuri
(74) *Attorney, Agent, or Firm* — Law Office of Gerald Maliszewski; Gerald Maliszewski

(57) ABSTRACT

A method is provided for fabricating an emissive display color conversion film. An emissive substrate top surface is conformally coated with an optically transparent carrier film, covering an array of emissive elements. A suspension, including a fluid and a color conversion material (e.g., QDs), is then selectively deposited in absorption regions overlying the emissive elements, for example, using inkjet patterning. After the suspension is absorbed into the absorption regions, the fluid is removed from the suspension, leaving the color conversion material in the absorption regions, and forming the color conversion film. The removal of the fluid encapsulates the color conversion material in the absorption regions. Typically, the conformal coating is thick enough to form a planar top surface. The conformally coating of carrier film may also act to encapsulate both properly aligned emissive elements, as well as misaligned emissive elements that may be located on the emissive substrate top surface.

30 Claims, 7 Drawing Sheets

Related U.S. Application Data continuation-in-part of application No. 15/440,735, filed on Feb. 23, 2017, which is a continuation-in-part of application No. 15/416,882, filed on Jan. 26, 2017, which is a continuation-in-part of application No. 15/413,053, filed on Jan. 23, 2017, which is a continuation-in-part of application No. 15/412,731, filed on Jan. 23, 2017, which is a continuation-in-part of application No. 15/410,195, filed on Jan. 19, 2017, now Pat. No. 10,236,279, which is a continuation-in-part of application No. 15/410,001, filed on Jan. 19, 2017, now Pat. No. 9,825,202, which is a continuation-in-part of application No. 15/221,571, filed on Jul. 27, 2016, now Pat. No. 9,755,110, and a continuation-in-part of application No. 15/197,266, filed on Jun. 29, 2016, now Pat. No. 10,249,599, and a continuation-in-part of application No. 15/190,813, filed on Jun. 23, 2016, now Pat. No. 9,892,944.

(51) Int. Cl.
*H01L 33/62* (2010.01)
*B41J 2/21* (2006.01)
*H01L 33/56* (2010.01)
*H01L 33/54* (2010.01)

(52) U.S. Cl.
CPC .......... *H01L 33/502* (2013.01); *H01L 33/507* (2013.01); *H01L 33/56* (2013.01); *H01L 33/62* (2013.01); *H01L 33/504* (2013.01); *H01L 33/54* (2013.01); *H01L 2933/005* (2013.01); *H01L 2933/0041* (2013.01); *H01L 2933/0066* (2013.01)

(56) References Cited

U.S. PATENT DOCUMENTS

2015/0084075 A1* 3/2015 Watanabe ............. H01L 33/501 257/98
2016/0300984 A1* 10/2016 Ozeki ................... H01L 33/504
2017/0352714 A1* 12/2017 Choi ................... H01L 27/3211

* cited by examiner

ABSORPTIVE COLOR CONVERSION FILM

RELATED APPLICATIONS

Any and all applications, if any, for which a foreign or domestic priority claim is identified in the Application Data Sheet of the present application are hereby incorporated by reference under 37 CFR 1.57.

BACKGROUND OF THE INVENTION

1. Field of the Invention

This invention generally relates to emissive displays and, more particularly, to a color management system for an emissive display made using a conformally coated absorptive color conversion film.

2. Description of the Related Art

A color display is typically composed of pixels that emit light in three wavelength bands corresponding to the visible colors red, green, and blue (RGB), often referred to as an RGB display. The RGB components of the pixel, referred to as sub-pixels, are turned on and off in a systematic way to additively produce the colors of the visible spectrum. There are several display types that produce the RGB images differently. Liquid crystal displays (LCD) are the most prevalent technology and they produce RGB images by shining a white light source, typically a phosphor produced white light emitting diode (LED), through the color filter of a sub-pixel. Some portion of the white light wavelength is absorbed and some transmitted through the color filter so that a large fraction of the light produced by the backlight unit (BLU) is lost. Organic light emitting diode (OLED) displays produce RGB light by the direct emission of each of those wavelengths of light at a pixel level within the organic light emitting material.

Another display technology is the micro-LED display. This display technology uses micro-sized inorganic LEDs for the direct emission of light at the pixel level. Micro-sized emissive elements may have a diameter or cross-section of less than 100 microns and they can be powered by thin-film transistor (TFT) arrays similar to those used for OLEDs. Micro-LED displays have the high contrast characteristic of direct emitting displays with the additional advantages of higher efficiency, brightness, and reliability as compared to OLED displays.

The largest challenge for the fabrication of micro-LED displays is the placement of millions of micro-LEDs on the display substrate in precise positions to connect with the electrical interfaces and form an array of pixels. Common methods for placing micro-LEDs are similar to those used to manufacture printed circuit boards. Pick-and-place assembly uses an actuator to pick up micro-LEDs one by one from a supply substrate, and then position the devices on the display substrate in a serial fashion. Mass transfer methods use a secondary substrate as a stamp, which is populated with micro-LEDs, and the stamp then places a small array of micro-LEDs on the display substrate. The complexity and cost for both techniques increase rapidly as the size of devices decreases and pixel density increases. For a typical high definition television (HDTV) with 6.2 million subpixels spaced 200 microns apart, the pick-and-place and-place assembly time can be several days. For 4K and 8K televisions the number of sub-pixels increases to 24.9 million and 99.5 million respectively, with a commensurate decrease in sub-pixel size, making conventional LED deposition techniques impractical.

An alternative technology for positioning micro-LEDs is fluidic assembly, which uses a fluid forcing mechanism to move micro-LEDs across the display substrate where they are captured and held in an array of trap sites with electrical interfaces. Because fluidic assembly is massively parallel, the method is both low cost and very fast with demonstrated assembly rates over 50 million devices an hour. Fluidic assembly uses micro-LEDs fabricated from conventional inorganic LED wafers made with gallium nitride (GaN), similar to the high reliability, low cost devices used for general lighting. However, the devices developed for fluidic assembly use specific electrode geometries to match the substrate electrodes and a post structure to ensure that the electrode is correctly oriented during the assembly process as described in U.S. Pat. No. 9,825,202, which is incorporated herein by reference.

There are two schemes for producing RGB displays using micro-LEDs. The first of which is to use three different micro-LEDs, with each LED emitting in a different range of RGB wavelengths. To do this, three different types of micro-LEDs need to be assembled onto the display. The second method is to assemble each sub-pixel using only one type of micro-LED (blue emitting for example) and use an overlayer that converts a portion of the blue sub-pixels from blue to red, and from blue to green. This conversion can be done efficiently using quantum dots (QDs) that absorb high energy blue wavelengths and emit at lower energy red and green wavelengths in narrow color bands.

Conventionally, the color filter for an LCD or micro-LED display is deposited, patterned, and printing with a color conversion material (e.g., QDs), or by photolithographically printing a film that is subsequently laminated to the display.

It would be advantageous if a color conversion film could be fabricated over an emissive substrate without the use of photolithographic or laminations steps. Such a process would simplify the assembly of a display and would be more tolerant of defects on the surface of a display.

It would be advantageous if color conversion materials could be directly printed into a blanket unpatterned optical layer that has been applied as a uniform coating on a display surface.

SUMMARY OF THE INVENTION

Disclosed herein is a color conversion structure, and a method of making said structure, that is fabricated on top of a micro-LED (light emitting diode) display substrate for the purpose of converting a single type of emission element (e.g., blue) to red and green wavelengths in order to make a full color red/green/blue (RGB) display. The color conversion structure consists of a specialized unpatterned blanket coating of an optically transparent material. This coating has the ability to swell or absorb a fluid or solvent such as a liquid hydrocarbon, alcohol, or water to name a few simple examples. As the coating can absorb a fluid, nano-scale color conversion material particles in the fluid can be carried into the coating along with the fluid, that remain locked within the coating after the fluid is removed. For example, the nano-scale particles may be quantum dots (QDs).

The disclosed color conversion film has many advantages over existing structures for making a color conversion layer. The coating can be applied directly to the top surface of the display substrate as a uniform unpatterned blanket coating. This coating process is straightforward in obtaining a desired thickness with any thick or thin film coating technique such as spray or slot coating. No other costly processes such as photolithography, lamination, or separate layers are needed to build a color filter containment structure. The coating provides the additional advantages of planarizing the top surface of the display, and encapsulating the emissive elements on the display surface, thus limiting environmental or mechanical degradation of the emitters.

The swellable coating may be a polymer that is optically clear, with an affinity to absorb hydrocarbons, such as dodecane, that may be used as the basis for a QD ink formulation. Examples of such polymers appear in the scientific literature as related to the selective absorption of hydrocarbons (such as crude oil) from aqueous bodies (ocean). Common or modified forms of hydrophobic polymers such as polyolefins (i.e., polyethylene and polypropylene) have been shown to absorb multiple times their weight in hydrocarbons. Linear Low-Density Polyethylene (LL-DPE) has been shown to absorb toluene in a wide range of weight fraction from 1/1 to 17:1. This film can be prepared in a thin film form by solvent casting. Absorption rates in this range are sufficient to absorb the comparably small amount of dodecane/QD in the QD inks. Similar absorption rates apply to other combinations of coating and suspension fluids.

The QDs may be dispensed in fluid on the swellable coating by a patterning method such as inkjet printing of the QD ink (for example, QD dispersed in dodecane). Absorption of the fluid by the coating limits the spread of the QDs laterally on surface of the display, which might otherwise occur on an impermeable surface such as glass. This helps to provide discrete sub-pixel regions such as red and green. Once the QD particles are locked within the swellable coating they are confined to a local region within the coating and the distance between QD particles is fixed to limit particle-to-particle self-absorption interactions that conventionally have shown to limit the efficiency within QD films. Also, after evaporation of the fluid, the coating shrinks, further encapsulating the QDs within the film and limiting their exposure to the environment.

Accordingly, a method is provided for fabricating an emissive display color conversion film. The method provides an emissive substrate with a top surface populated by an array of emissive elements. The emissive substrate top surface is conformally coated with an optically transparent carrier film, covering the emissive elements. A suspension, including a fluid and a color conversion material (e.g., QDs), is then selectively deposited in absorption regions overlying the emissive elements, for example, using inkjet patterning. After the suspension is absorbed into the absorption regions, the suspension is modified, leaving the color conversion material in the absorption regions, and forming the color conversion film.

In one aspect, the step of modifying the suspension includes the removal of the fluid, thus encapsulating the color conversion material in the absorption regions. Otherwise, an organic monomer fluid may be polymerized and retained in the absorption regions. Typically, the step of conformally coating the emissive substrate top surface with the optically transparent carrier film deposits the carrier film with a thickness sufficient to form a planar top surface. The conformal coating of the optically transparent carrier film may also act to encapsulate both properly aligned emissive elements, as well as misaligned emissive elements that may be located on the emissive substrate top surface.

In one aspect, such as might be useful in an liquid crystal display (LCD) backlight (BLU) application, the emissive elements are capable of emitting a first wavelength of light (e.g., blue), with the absorption regions being capable of emitting a second wavelength of light (e.g., white), different than the first wavelength. Otherwise in an RGB emissive display application, the emissive elements are organized into a plurality of pixels, with each pixel comprising at least three emissive elements capable of emitting a first wavelength of light (e.g., blue). Then, the step of selectively depositing the suspension includes substeps. A first suspension is selectively deposited, including a first color conversion material capable of emitting a second wavelength of light (e.g., green), overlying a first absorption region of each pixel. A second suspension is selectively deposited, including a second color conversion material, capable of emitting a third wavelength of light (e.g., red), overlying a second absorption region of each pixel. If the emissive elements emit blue light, no color conversion material is formed over one of the emissive elements of each pixel. In another variation, the emissive elements emit light in the ultraviolet (UV) wavelengths, in which case a third suspension is selectively deposited, including a third color conversion material, capable of emitting a fourth wavelength of light (e.g., blue) different from the first, second, and third wavelengths of light, overlying a third absorption region of each pixel.

As noted above, the optically transparent carrier film may be a polymer, and the suspension fluid may be a hydrocarbon (e.g., dodecane), organic monomer, alcohol, or water. Some examples of enabling polymers include polyolefins, such as polyethylene and polypropylene, and LLDPE.

In one aspect, the emissive substrate includes a plurality of wells formed in the emissive substrate top surface, with each well having a bottom surface with two electrical interfaces formed on the bottom surface. In this aspect the emissive elements are (flip-chip) inorganic LEDs, with each LED having two electrical contacts formed on their top surface (facing into the well) connected to the electrical interfaces of a corresponding well. Alternatively, each well has one electrical interface formed on its bottom surface, which is connected to the single top surface electrical contact of a (vertical) LED. An electrical interface on the substrate top surface, formed before the deposition of the carrier film, is connected to an electrical contact on the LED bottom surface. In either case, the LEDs may be deposited in the wells using a solution flow deposition process.

Additional details of the above-described method and an emissive display color conversion film are provided below.

DETAILED DESCRIPTION

Figure 1A:
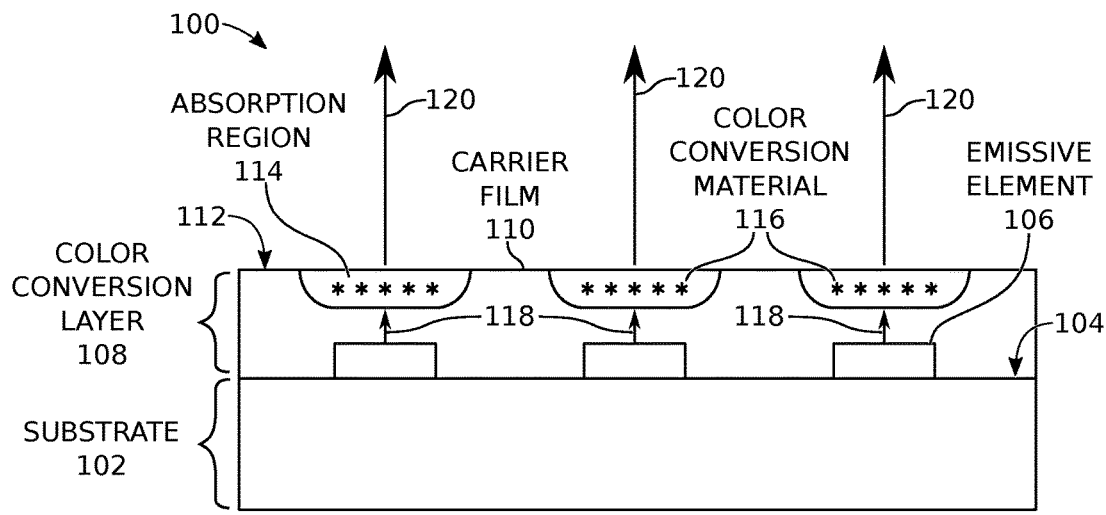
FIGS. 1A and 1B are partial cross-sectional views of an emissive display color conversion film.
Figure 1B:
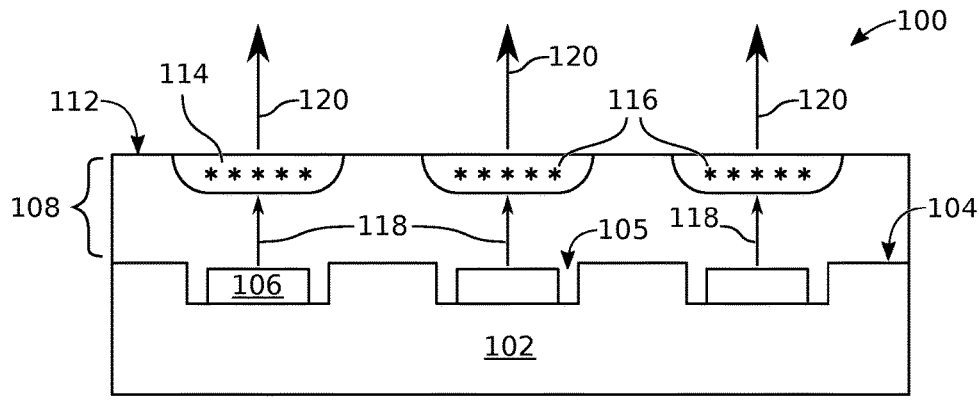

FIGS. 1A and 1B are partial cross-sectional views of an emissive display color conversion film. The emissive display color conversion film 100 comprises an emissive substrate 102 having a top surface 104 populated with an array of emissive elements 106. In FIG. 1A the emissive elements 106 are deposited on the substrate top surface 104 in a display array at the required sub-pixel pitch by some method such as pick-and-place assembly. In FIG. 1B the emissive elements 106 are located in wells 105 that are formed in the emissive substrate top surface 104 to enable positioning of the emissive elements by means of fluidic assembly. A color conversion layer 108 comprises a transparent carrier film 110 with a top surface 112, conformally coating the emissive substrate top surface 104. Typically, the transparent carrier film top surface 112 is planar, as shown. An absorption region 114 is formed in the carrier film top surface 112 overlying emissive elements 106. A color conversion material 116 occupies each absorption region 114. In one aspect, the color conversion material 116 comprises quantum dots (QDs). Quantum well structures for color conversion can also have the structure of quantum platelets or quantum rods. These structures are quite small with dimensions in the range of 2 to 50 nanometers (nm) for quantum platelets. Phosphors are another type of color conversion material that may be used. However, since phosphors are generally larger than QDs, in the range of tens of microns, they are less able to penetrate and become trapped in the carrier film.

As represented in the figures by reference designator 118, the emissive elements 106 are capable of emitting a first wavelength of light under the control of electrical circuits in the substrate that are not shown. For example, the emissive elements 106 may be inorganic micro-sized light emitting diodes (LEDs) emitting a blue color wavelength. In the case of a local dimming backlight application (BLU), the absorption regions 114 are capable of emitting a second wavelength of light, represented by reference designator 120, different than the first wavelength. For example, the color conversion material may be a mixture of materials emitting light in the red and green wavelengths, so that the overall color emitted by display 100 is white (multi-colored light). This type of display may be used as a backlight in conjunction with a conventional liquid crystal display (LCD) to enhance image quality. In a typical application for a small display that might be used in a cell phone, the backlight may have a few thousand micro-LEDs arranged in a low-resolution array of a few hundred pixels so that the backlight can adjust the intensity in different areas of the display to match the intensity of the image being displayed. Local dimming of the backlight enhances the display by increasing contrast while also improving the efficiency of the display.

In one aspect, the carrier film 110 is an optically transparent polymer, examples of which include polyolefins, such as polyethylene and polypropylene, and linear low-density polyethylene (LLDPE). The carrier film 110 has an affinity for the absorption of a fluid (not shown) that carries the color conversion material 116. Some examples of enabling fluids include water, alcohols, hydrocarbons, and organic monomers.

A hydrocarbon such as dodecane has favorable inkjet properties, including a viscosity of 1.36 milli-Pascal-seconds (mPa·s) and a surface tension of 25.36 milli-Newtons per meter (mN/m), which is compatibility with many types of QDs. It is also possible to functionalize QDs with various coatings to make them compatible with polar solvents for example, or with aqueous systems. The carrier film 110 is chosen to be a material capable of being swollen by the selected suspension fluid, and should also be compatible with the selected color conversion material 116 and suspension deposition method (e.g., inkjet printer). Also, in practice the fluid system used to deliver the color conversion material 116 may not be a single component, such as dodecane, but rather a mixture of solvents or additives that impart favorable printing or deposition properties, such as might be related to the viscosity and surface tension of the suspension.

An organic monomer can be polymerized after the deposition of the color conversion material 116 on the carrier film by heating or exposure to ultraviolet (UV) radiation, so that the monomers become cross-linked or react with each other to form a robust film of longer chain polymers. That is, the polymerized monomer becomes part of the carrier 110 film in the absorption region to lock the color conversion material 116 into position. As shown in FIG. 5H, the polymerized monomer forms a polymer layer in the absorptive region.

Figure 2A:
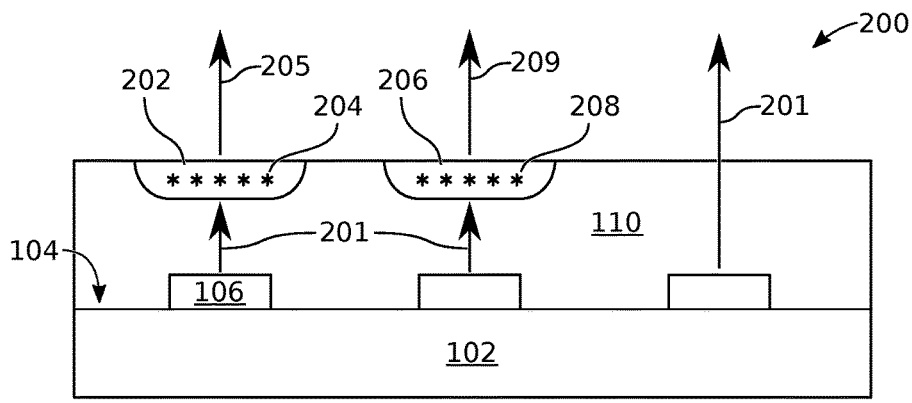
FIGS. 2A through 2C are partial cross-sectional views depicting a red/green/blue (RGB) emissive display color conversion film.
Figure 2B:
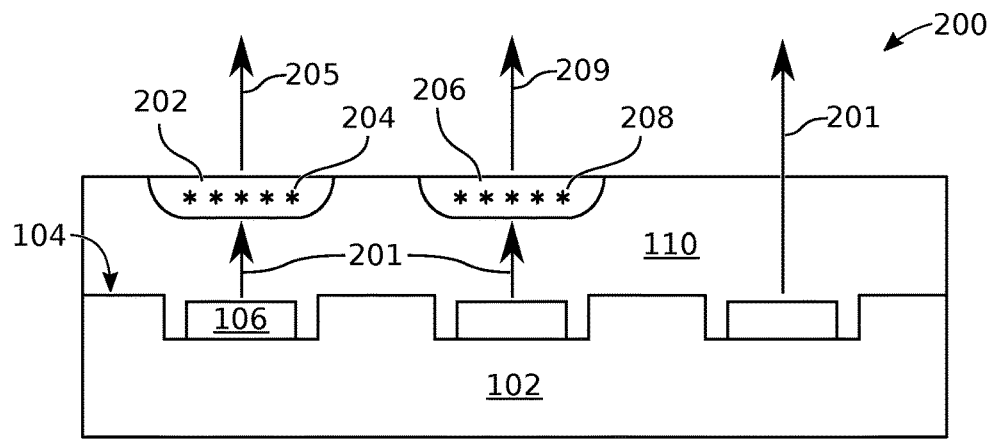
Figure 2C:
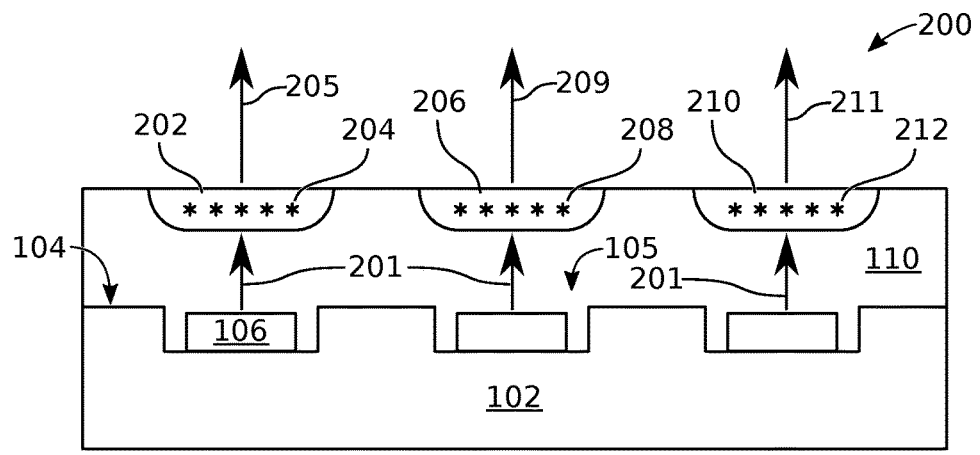

FIGS. 2A through 2C are partial cross-sectional views depicting a red/green/blue (RGB) emissive display color conversion film. In FIG. 2A the emissive elements 106 are formed on the substrate top surface 104. In FIGS. 2B and 2C the emissive elements 106 are located in wells 105 that are formed in the emissive substrate top surface 104. As above, the emissive elements 106 in the array are capable of emitting a first wavelength of light, as represented by reference designator 201, and are organized into a plurality of pixels 200. One pixel 200 is shown. Each pixel 200 comprises a first absorption region 202 with a corresponding first color conversion material 204 capable of emitting light at a second wavelength of light (represented by reference designator 205), different than the first wavelength of light 201. A second absorption region 206 comprises a corresponding second color conversion material 208 capable of emitting light at a third wavelength of light (represented by reference designator 209), different from the first (201) and second (205) wavelengths of light. For example, if the first wavelength corresponds to a blue color, the second and third wavelengths may respectively correspond to green and red colors. Assuming that the first wavelength is a visible color (e.g., blue) one of the emissive elements 106 is left uncovered by color conversion material.

FIG. 2C comprises a third absorption region 210 with a corresponding third color conversion material 212 capable of emitting light at a fourth wavelength of light (represented by reference designator 211), different from the first (201), second (205), and third (209) wavelengths of light. For example, if the first wavelength is in the ultraviolet (UV) spectrum, the second, third, and fourth wavelengths may respectively correspond to green, red, and blue colors. In another variation not shown, each pixel comprises four emissive elements 106, one of which is not covered with an absorption region. For example, if the first wavelength corresponds to a blue color, the second, third, and fourth wavelengths may respectively correspond to green, red, and yellow or white colors.

Figure 3A:
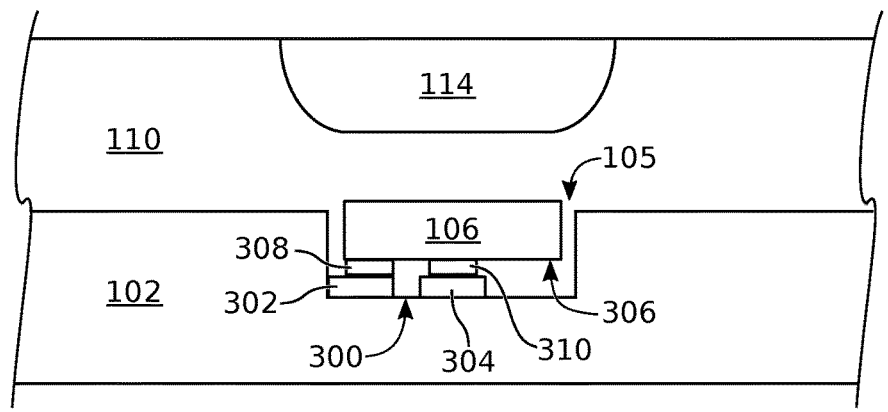
FIGS. 3A and 3B are partial cross-sectional views depicting alternative variations of the substrate-to-emissive element electrical interface.
Figure 3B:
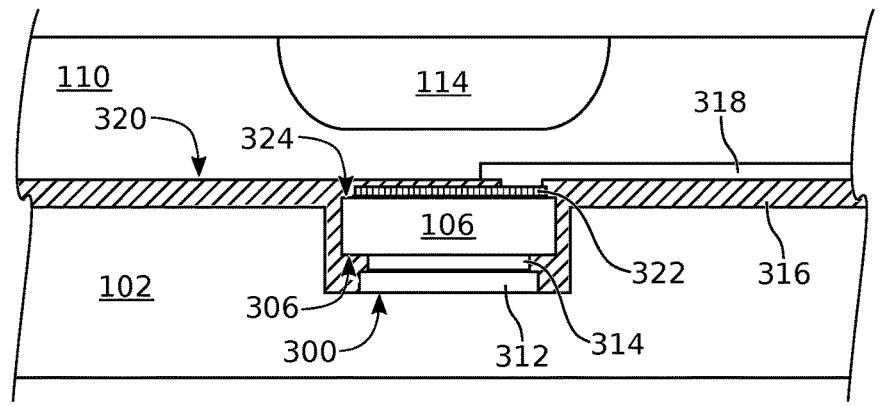

FIGS. 3A and 3B are partial cross-sectional views depicting alternative variations of the substrate-to-emissive element electrical interface. Micro-LEDs emit light when an electrical bias is applied across the junction formed by a Multiple Quantum Well (MQW) structure, so the display substrate provides circuits to apply a voltage between the anode and cathode terminals of the micro-LED. As in FIGS. 1B, 2B, and 2C, the emissive substrate 102 comprises a plurality of wells 105 formed in the emissive substrate top surface 104 that precisely position each micro-LED during the fluid assembly process. Typically, the well depth is chosen to be about the same as the thickness of the micro-LED and the width of the well is chosen to be slightly larger than the width of the micro-LED so that the micro-LEDs are captured effectively. In FIG. 3A each well 105 has a bottom surface 300 with two electrical interfaces 302 and 304, formed on the bottom surface. The emissive elements 106 are flip-chip inorganic LEDs having a top surface 306 with two electrical contacts 308 and 310 formed on the LED top surface, connected to the corresponding electrical interfaces 302 and 304 of a corresponding well 105.

In FIG. 3B, each well bottom surface 300 has a single electrical interface 312, and vertical inorganic micro-LEDs 106 have a single electrical contact 314 formed on their top surface 306, connected to the electrical interface 312 of a corresponding well. The vertical LED 106 and top surface are covered by an insulating layer 316. An electrical interface line 318, interposed between the insulating layer top surface 320 and the carrier film 320, is connected to an electrode 322 on the vertical LED bottom surface 324.

Figure 4:
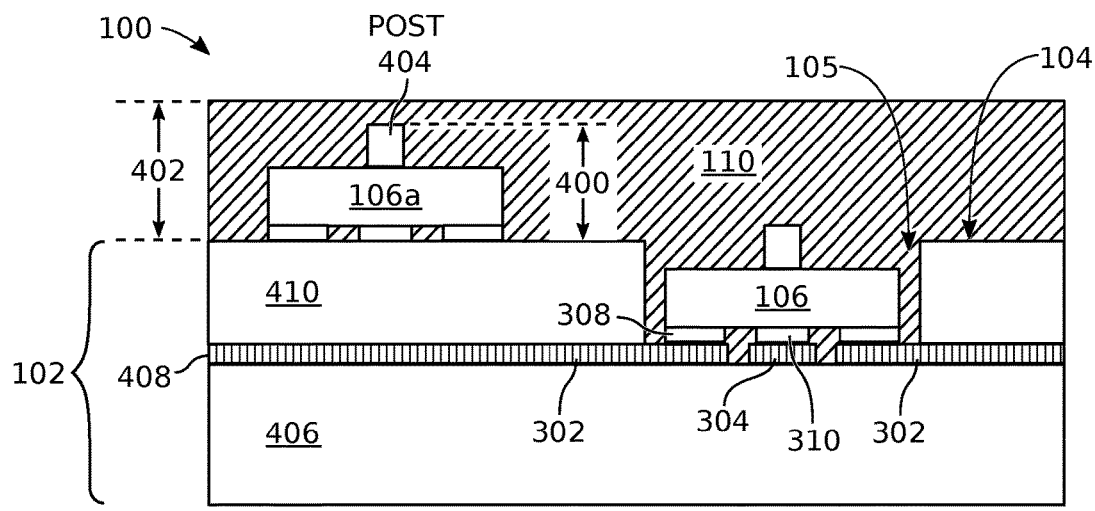
FIG. 4 is a partial cross-sectional view depicting the use of the color conversion layer to encapsulate misaligned emissive elements.

FIG. 4 is a partial cross-sectional view depicting the use of the color conversion layer to encapsulate misaligned emissive elements. In this variation the emissive substrate 102 again comprises wells 105 formed in the emissive substrate top surface 104. Emissive element 106 has a first thickness 400 and populates well 105. One misaligned emissive element 106a is shown residing on the emissive substrate top surface 104 adjacent to a well 105. The optically transparent carrier film 110 has a second thickness 402 at least equal to the first thickness 400, but typically greater than the first thickness, encapsulating the misaligned emissive element 106a. In this example the emissive elements 106 also include a post 404 that is helpful in orienting the emissive elements in a flow deposition process so that the electrodes are properly positioned to interface with the electrical interface in the well bottom. The substrate 102 may include a foundation layer 406 made from a transparent material such as glass or plastic, but alternatively the material could be a non-transparent plastic, metal, or silicon material. The substrate 102 also includes an electrical interface/active component layer 408 and a dielectric layer 410 into which the well 105 is formed. As in FIG. 3A, the emissive elements in this example have two electrical contacts 308 and 310 connected to well interfaces 302 and 304.

Figure 5A:
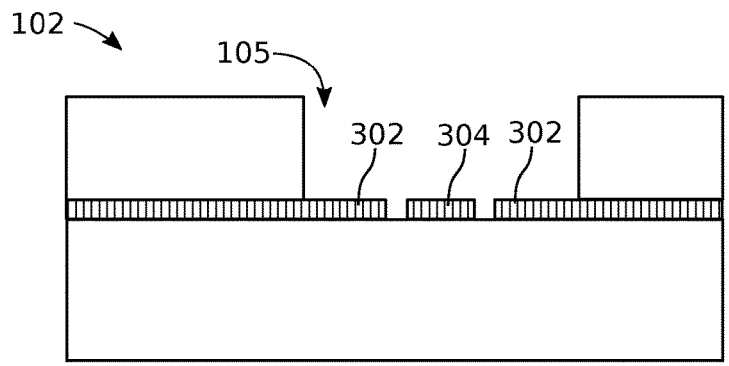
FIGS. 5A through 5H are partial cross-sectional views depicting steps in an exemplary emissive display color conversion film fabrication process.
Figure 5B:
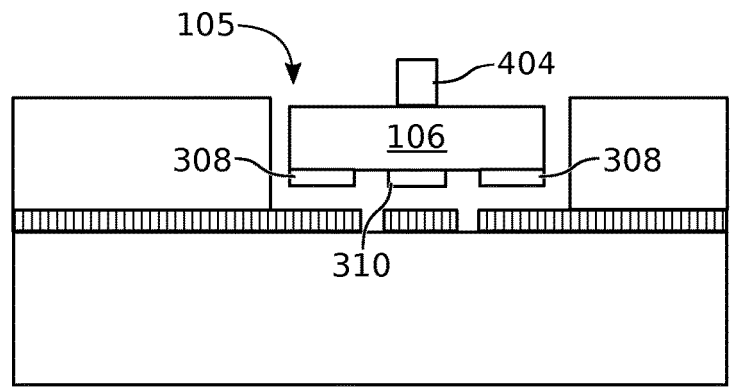
Figure 5C:
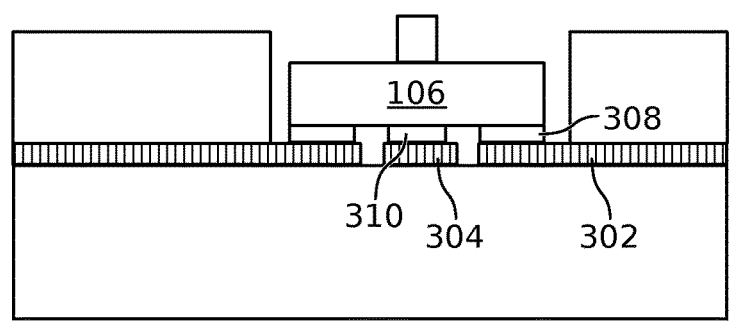
Figure 5D:
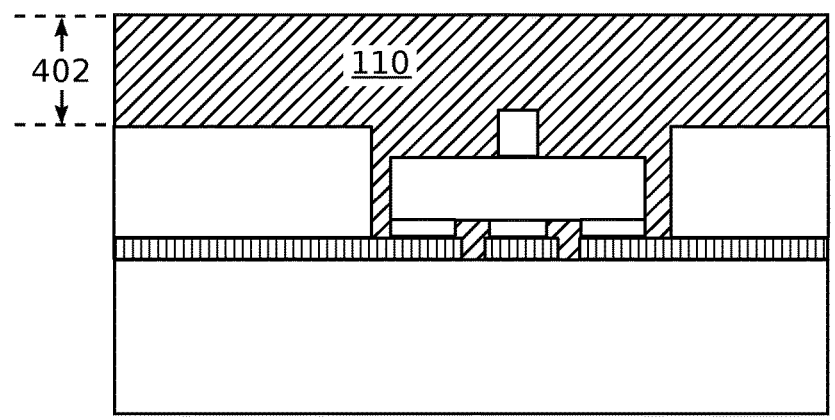
Figure 5E:
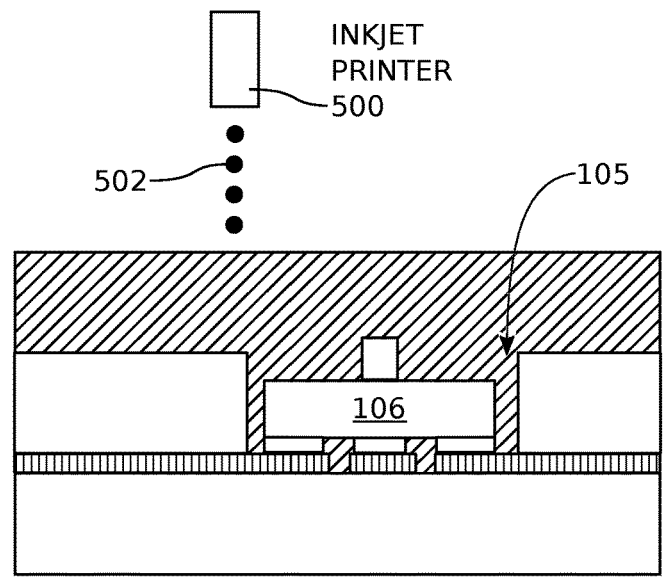
Figure 5F:
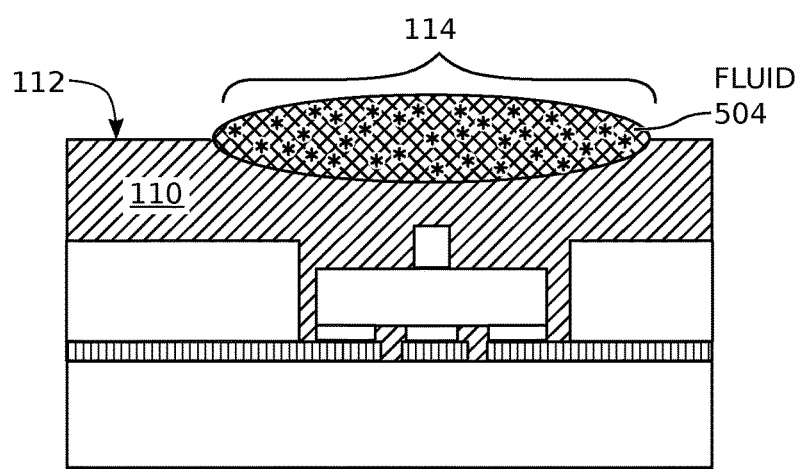
Figure 5G:
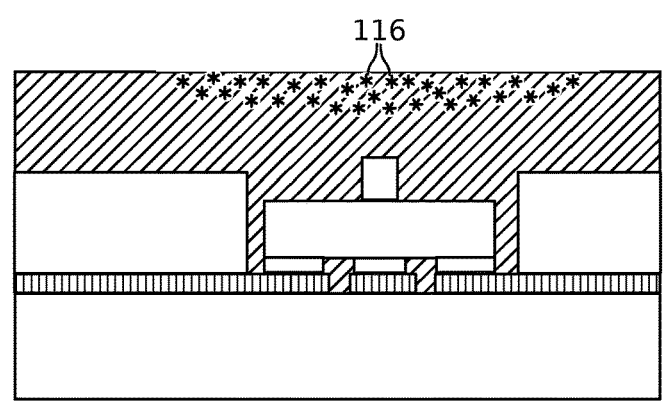
Figure 5H:
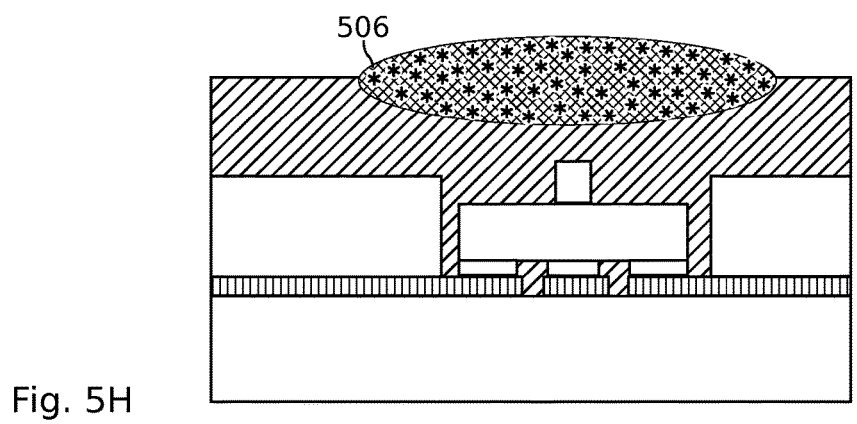

FIGS. 5A through 5H are partial cross-sectional views depicting steps in an exemplary emissive display color conversion film fabrication process. In FIG. 5A a well 105 is formed in emissive substrate 102 exposing electrical interfaces 302 and 304. In FIG. 5B an emissive element 106 is deposited in the well 105. As shown in this example, the emissive element includes a post 404 and electrical contacts 308 and 310. In FIG. 5C the emissive element contacts 308 and 310 are bonded to the exposed electrical interfaces 302 and 304. In FIG. 5D a uniform blanket overcoat optically transparent carrier film 110 is deposited. As mentioned above, the carrier film 110 may be a swellable polymer layer. Layer 110 has a thickness 402 in the range of 3-100 microns, typically 5 microns.

In FIG. 5E an inkjet printer 500 may be used to deposit a suspension 502 comprising a color conversion material, such as quantum dots, in a fluid. The pattern of deposition is aligned with the position of the emissive element (i.e., the position of the well 105). In FIG. 5F the suspension containing the color conversion material 116 and fluid 504 is readily absorbed into the swellable carrier film 110 creating absorption region 114, while limiting the spread of color conversion material on the carrier film top surface 112. In FIG. 5G the fluid is evaporated or otherwise removed from the swellable carrier film 110, fixing the color conversion material 116 to locations within the swellable carrier film and encapsulating the color conversion material within the swellable carrier film. Alternatively, as shown in FIG. 5H, if a monomer fluid is used, it has been cross-linked or polymerized to form a polymer layer 506 in the absorptive region, providing protection to the color conversion material.

Figure 6:
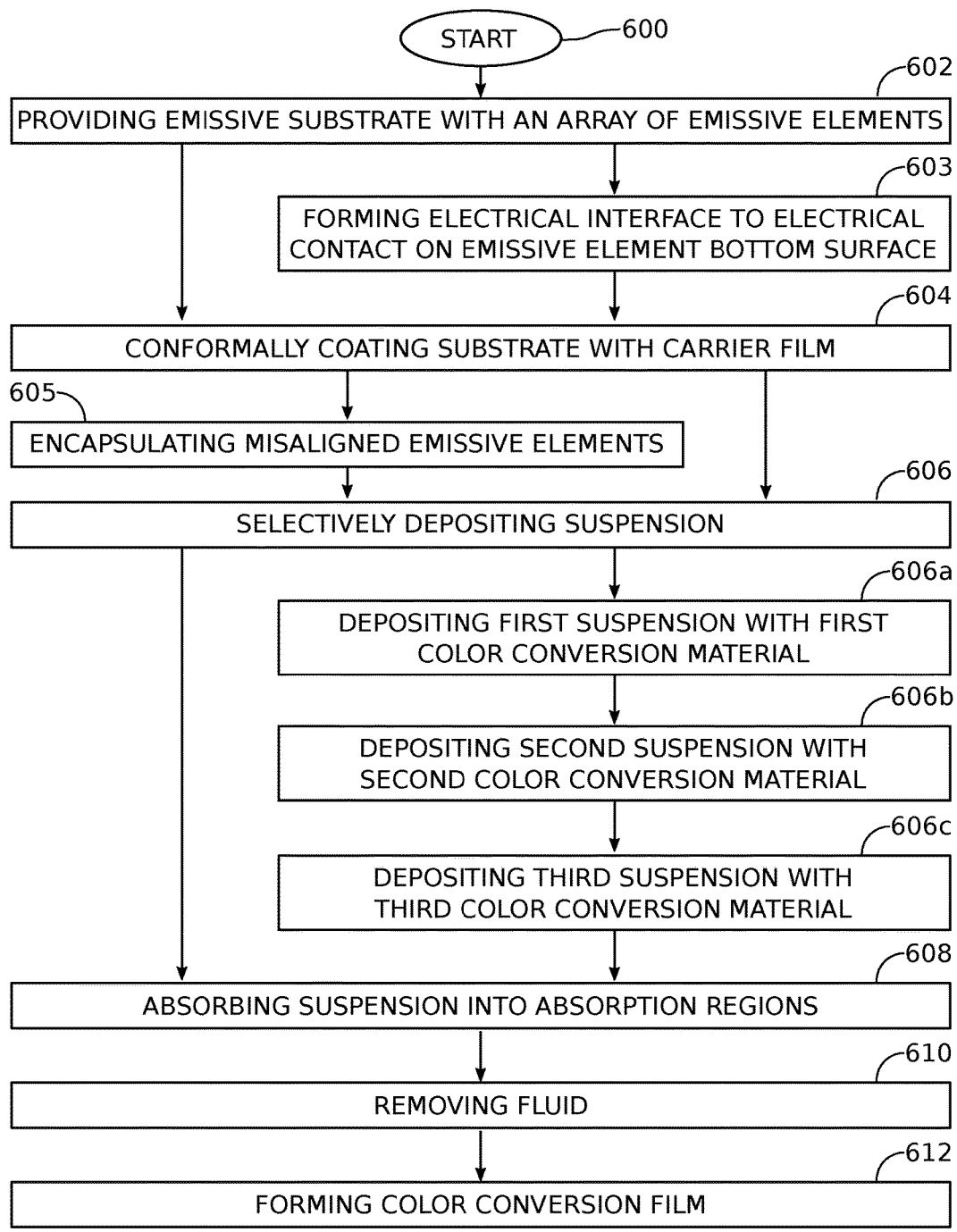
FIG. 6 is a flowchart illustrating a method for fabricating an emissive display color conversion film.

FIG. 6 is a flowchart illustrating a method for fabricating an emissive display color conversion film. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. Generally however, the method follows the numeric order of the depicted steps. The method starts at Step 600.

Step 602 provides an emissive substrate comprising a top surface populated by an array of emissive elements. Step 604 conformally coats the emissive substrate top surface with an optically transparent carrier film, covering the emissive elements. Typically, the optically transparent carrier film is deposited with a thickness sufficient to form a planar top surface. It is also typical that by conformally coating the emissive substrate top surface with the optically transparent carrier film, the emissive elements become encapsulated to protect them from subsequent processes and environments. As noted above, the optically transparent carrier film may be a polymer, examples of which include polyolefins, such as polyethylene and polypropylene, and LLDPE.

Step 606 selectively deposits a suspension including a fluid and a color conversion material (e.g., QDs) in absorption regions overlying the emissive elements. Some examples of enabling fluids may include hydrocarbons, organic monomers, alcohol, and water. In one aspect the suspension is deposited by pattern inkjet printing. In Step 608 the suspension is absorbed into the absorption regions. Step 610 modifies the suspension, leaving the color conversion material in the absorption regions. This step helps to encapsulate the color conversion material in the absorption regions. If the suspension includes a monomer fluid, Step 610 polymerizes the monomer and forms a polymer layer in the absorptive region. In other aspects, the suspension becomes modified when the fluid is evaporated or otherwise removed. Step 612 forms the finished product color conversion film.

If the emissive elements provided in Step 602 are only capable of emitting a first wavelength of light, then, in one aspect (e.g., a backlight application), Step 608 may form absorption regions capable of emitting a second wavelength of light, different than the first wavelength.

In another aspect, Step 602 provides an array of emissive elements organized into a plurality of pixels, with each pixel comprising at least three emissive elements capable of emitting a first wavelength of light. Then, selectively depositing the suspension in Step 606 includes substeps. Step 606a selectively deposits a first suspension including a first color conversion material, capable of emitting a second wavelength of light different than the first wavelength of light, overlying a first absorption region of each pixel. Step 606b selectively deposits a second suspension including a second color conversion material, capable of emitting a third wavelength of light different from the first and second wavelengths of light, overlying a second absorption region of each pixel. In another aspect, Step 606c selectively deposits a third suspension including a third color conversion material, capable of emitting a fourth wavelength of light different from the first, second, and third wavelengths of light, overlying a third absorption region of each pixel.

In another aspect, Step 602 provides an emissive substrate with a plurality of wells formed in the emissive substrate top surface, with each well having a bottom surface with two electrical interfaces formed on the bottom surface. Step 602 also provides inorganic LED emissive elements having a top surface. Each LED has two electrical contacts formed on the LED top surface, with each electrical contact connected to a corresponding electrical interface of a corresponding well, see FIG. 3A. Alternatively (FIG. 3B), each well bottom surface may have a single electrical interface and each LED has a single electrical contact formed on the LED top surface, connected to the electrical interface of a corresponding well, and an electrical contact formed on the LED bottom surface. Then, prior to depositing the carrier film in Step 604, Step 603 forms an electrical interface on the substrate top surface connected to the electrical contact on the LED bottom surface.

In one variation, Step 602 provides an emissive substrate with a plurality of wells formed in the emissive substrate top surface, and deposits the emissive elements in the wells using a solution flow deposition process. In another variation, Step 602 provides an emissive substrate with a first plurality of wells formed in the emissive substrate top surface, with the emissive elements having a first thickness. However deposited, Step 602 also provides a first plurality of emissive elements populating the wells, and a second plurality of misaligned emissive elements residing on the emissive substrate top surface adjacent to the wells. Then, conformally coating the emissive substrate top surface with the optically transparent carrier film in Step 604 includes conformally coating the emissive substrate top surface with an optically transparent carrier film having a second thickness, greater than the first thickness. Step 605 encapsulates the misaligned emissive elements with the optically transparent carrier film.

An emissive display color conversion film and associated fabrication method have been provided. Examples of particular materials and process steps have been presented to illustrate the invention. However, the invention is not limited to merely these examples. Other variations and embodiments of the invention will occur to those skilled in the art.

I claim:

1. An emissive display color conversion film comprising:
an emissive substrate comprising a top surface populated with an array of emissive elements;
a color conversion layer comprising:
a transparent carrier film with a top surface, conformally coating the emissive substrate top surface with a first thickness;
a plurality of absorption regions formed in the carrier film top surface and having a second thickness less than the first thickness, each absorption region overlying a corresponding emissive element and separated from adjacent absorptive regions by the transparent carrier film; and,
a color conversion material occupying only the absorption regions of the color conversion layer.

2. The emissive display color conversion film of claim 1 wherein the color conversion layer has a planar top surface.

3. The emissive display color conversion film of claim 1 wherein the color conversion material comprises quantum dots (QDs).

4. The emissive display color conversion film of claim 1 wherein the emissive elements are capable of emitting a first wavelength of light; and,
wherein absorption regions are capable of emitting a second wavelength of light, different than the first wavelength.

5. The emissive display color conversion film of claim 1 wherein the array of emissive elements, capable of emitting a first wavelength of light, is organized into a plurality of pixels, each pixel comprising:
a first absorption region with a corresponding first color conversion material capable of emitting light at a second wavelength of light, different than the first wavelength of light; and,
a second absorption region with a corresponding second color conversion material capable of emitting light at a third wavelength of light, different from the first and second wavelengths of light.

6. The emissive display color conversion film of claim 1 wherein the carrier film is an optically transparent polymer.

7. The emissive display color conversion film of claim 6 wherein the carrier film has an affinity for the absorption of a fluid selected from the group consisting of water, alcohol, hydrocarbons, and organic monomers.

8. The emissive display color conversion film of claim 6 wherein the polymer is selected from the group consisting of polyolefins, with the polyolefins selected from the group consisting of polyethylene and polypropylene, and linear low-density polyethylene (LLDPE).

9. The emissive display color conversion film of claim 1 wherein the emissive substrate comprises a plurality of wells formed in the emissive substrate top surface, each well having a bottom surface with two electrical interfaces formed on the bottom surface; and,
wherein the emissive elements are inorganic light emitting diodes (LEDs) having a top surface, each LED having two electrical contacts formed on the LED top surface, with each electrical contact connected to a corresponding electrical interface of a corresponding well.

10. The emissive display color conversion film of claim 1 wherein the emissive substrate comprises a plurality of wells formed in the emissive substrate top surface, each well having a bottom surface with a single electrical interface formed on the bottom surface;
wherein the emissive elements are inorganic LEDs having a top surface, each LED having a single electrical contact formed on the LED top surface, connected to a corresponding electrical interface of a corresponding well, and an electrical contact formed an LED bottom surface; and,
the emissive display color conversion film further comprising:
an electrical interface formed on the substrate top surface connected to the electrical contact on the LED bottom surface.

11. The emissive display color conversion film of claim 1 wherein the emissive substrate comprises a first plurality of wells formed in the emissive substrate top surface;
wherein the emissive elements have a third thickness, with a first plurality of emissive elements populating the wells and a second plurality of misaligned emissive elements residing on the emissive substrate top surface adjacent to the wells; and,
wherein the color conversion layer first thickness, greater than the third thickness, encapsulates the misaligned emissive elements.

12. The emissive display color conversion film of claim 1 wherein the array of emissive elements, capable of emitting a first wavelength of light, is organized into a plurality of pixels, each pixel comprising:
- a first absorption region with a corresponding first color conversion material capable of emitting light at a second wavelength of light, different than the first wavelength of light;
- a second absorption region with a corresponding second color conversion material capable of emitting light at a third wavelength of light, different from the first and second wavelengths of light; and,
- a third absorption region with a corresponding third color conversion material capable of emitting light at a fourth wavelength of light, different from the first, second, and third wavelengths of light.

13. The emissive display color conversion film of claim 1 further comprising:
a polymerized monomer layer in the absorption region.

14. A method for fabricating an emissive display color conversion film, the method comprising:
- providing an emissive substrate comprising a top surface populated by an array of emissive elements;
- conformally coating the emissive substrate top surface with an optically transparent carrier film having a top surface and a first thickness, covering the emissive elements;
- selectively depositing a suspension, including a fluid and a color conversion material, over the transparent carrier film forming a plurality of absorption regions, each absorptive region overlying a corresponding emissive element and separated from adjacent absorptive regions by the transparent carrier film;
- absorbing the suspension into the absorption regions;
- modifying the suspension, leaving the color conversion material in only the absorption regions and forming absorptive regions in the transparent carrier film top surface having a second thickness, less than the first thickness; and,
- forming the color conversion film.

15. The method of claim 14 wherein modifying the suspension includes encapsulating the color conversion material in the absorption regions.

16. The method of claim 14 wherein selectively depositing the suspension includes inkjet patterning the suspension.

17. The method of claim 14 wherein conformally coating the emissive substrate top surface with the optically transparent carrier film includes depositing the optically transparent carrier film with sufficient thickness to form a planar top surface.

18. The method of claim 14 wherein conformally coating the emissive substrate top surface with the optically transparent carrier film includes encapsulating the emissive elements.

19. The method of claim 14 wherein selectively depositing the suspension includes the color conversion material comprising quantum dots (QDs).

20. The method of claim 14 wherein providing the array of emissive elements includes providing emissive elements capable of emitting a first wavelength of light; and,
wherein absorbing the suspension in the absorption regions includes forming absorption regions capable of emitting a second wavelength of light, different than the first wavelength.

21. The method of claim 14 wherein providing the array of emissive elements includes providing emissive elements organized into a plurality of pixels, with each pixel comprising at least three emissive elements capable of emitting a first wavelength of light;
wherein selectively depositing the suspension includes:
- selectively depositing a first suspension including a first color conversion material, capable of emitting a second wavelength of light different than the first wavelength of light, overlying a first absorption region of each pixel; and,
- selectively depositing a second suspension including a second color conversion material, capable of emitting a third wavelength of light different from the first and second wavelengths of light, overlying a second absorption region of each pixel.

22. The method of claim 14 wherein conformally coating the emissive substrate top surface with the optically transparent carrier film includes conformally coating the emissive substrate with an optically transparent polymer.

23. The method of claim 22 wherein selectively depositing the suspension including the fluid includes selectively depositing a fluid selected from the group consisting of a hydrocarbon, organic monomer, alcohol, and water.

24. The method of claim 22 wherein conformally coating the emissive substrate with the optically transparent polymer includes the polymer being selected from the group consisting of polyolefins, with the polyolefins selected from the group consisting of polyethylene and polypropylene, and linear low-density polyethylene (LLDPE).

25. The method of claim 14 wherein providing the emissive substrate includes:
- providing an emissive substrate with a plurality of wells formed in the emissive substrate top surface, each well having a bottom surface with two electrical interfaces formed on the bottom surface; and,
- providing inorganic light emitting diode (LED) emissive elements having a top surface, each LED having two electrical contacts formed on the LED top surface, with each electrical contact connected to a corresponding electrical interface of a corresponding well.

26. The method of claim 14 wherein providing the emissive substrate includes:
- providing an emissive substrate with a plurality of wells formed in the emissive substrate top surface, each well having a bottom surface with a single electrical interface formed on the bottom surface;
- providing inorganic LED emissive elements having a top surface, each LED having a single electrical contact formed on the LED top surface, connected to a corresponding electrical interface of a corresponding well, and an electrical contact formed on an LED bottom surface; and,
the method further comprising:
prior to depositing the carrier film, forming an electrical interface on the substrate top surface connected to the electrical contact on the LED bottom surface.

27. The method of claim 14 wherein providing the emissive substrate includes:
- providing an emissive substrate with a plurality of wells formed in the emissive substrate top surface; and,
- depositing the emissive elements in the wells using a solution flow deposition process.

28. The method of claim 14 wherein providing the emissive substrate includes:
- providing an emissive substrate with a first plurality of wells formed in the emissive substrate top surface;
- providing emissive elements having a third thickness;
- providing a first plurality of emissive elements populating the wells;

providing a second plurality of misaligned emissive elements residing on the emissive substrate top surface adjacent to the wells;
wherein conformally coating the emissive substrate top surface with the optically transparent carrier film includes conformally coating the emissive substrate top surface with the optically transparent carrier film first thickness, greater than the third thickness; and,
the method further comprising:
encapsulating the misaligned emissive elements with the optically transparent carrier film.

29. The method of claim 14 wherein providing the array of emissive elements includes providing emissive elements organized into a plurality of pixels, with each pixel comprising at least three emissive elements capable of emitting a first wavelength of light;
wherein selectively depositing the suspension includes:
selectively depositing a first suspension including a first color conversion material, capable of emitting a second wavelength of light different than the first wavelength of light, overlying a first absorption region of each pixel;
selectively depositing a second suspension including a second color conversion material, capable of emitting a third wavelength of light different from the first and second wavelengths of light, overlying a second absorption region of each pixel; and,
selectively depositing a third suspension including a third color conversion material, capable of emitting a fourth wavelength of light different from the first, second, and third wavelengths of light, overlying a third absorption region of each pixel.

30. The method of claim 14 wherein selectively depositing the suspension including the fluid includes selectively depositing a monomer fluid; and,
wherein removing the fluid from the suspension includes polymerizing the monomer fluid to form a polymer layer in the absorptive region.

* * * * *